_United States Patent_ [19]

Johnston et al.

[11] Patent Number: 5,032,787
[45] Date of Patent: Jul. 16, 1991

[54] ELECTRICAL TEST PROBE HAVING ROTATIONAL CONTROL OF THE PROBE SHAFT

[75] Inventors: Charles J. Johnston, Walnut; Mark A. Swart, Upland, both of Calif.

[73] Assignee: Everett/Charles Contact Products, Inc., Pomona, Calif.

[21] Appl. No.: 431,477

[22] Filed: Nov. 3, 1989

[51] Int. Cl.$^5$ .................. G01R 31/02; H01R 13/16
[52] U.S. Cl. .................. 324/158 P; 324/72.5; 324/158 F; 439/482
[58] Field of Search ............ 324/158 F, 158 P, 72.5; 439/482, 824

[56] References Cited

U.S. PATENT DOCUMENTS

| | | | |
|---|---|---|---|
| 2,970,260 | 1/1961 | Flint | 324/73.1 |
| 3,315,163 | 4/1967 | Lutz . | |
| 4,200,351 | 4/1980 | Long et al. | 439/824 |
| 4,245,189 | 1/1981 | Wahl et al. | 324/158 P |
| 4,307,928 | 12/1981 | Petlock, Jr. | 324/158 F |
| 4,491,788 | 1/1985 | Zandonatti | 324/72.5 |
| 4,560,926 | 12/1985 | Cornu et al. | 324/158 P |
| 4,658,212 | 4/1987 | Ozawa et al. | 324/158 P |
| 4,701,702 | 10/1987 | Kruger | 324/158 P |
| 4,787,861 | 11/1988 | Kruger et al. | 439/482 |

FOREIGN PATENT DOCUMENTS

| | | | |
|---|---|---|---|
| 0068986 | 1/1983 | European Pat. Off. | 324/158 P |
| 3410093 | 10/1985 | Fed. Rep. of Germany | 324/158 P |

OTHER PUBLICATIONS

IBM Technical Disclosure Bulletin, vol. 15, No. 1, Jun. 1972, p. 58, "Spring Plunger Contact".

_Primary Examiner_—Kenneth Wieder
_Assistant Examiner_—Vinh P. Nguyen
_Attorney, Agent, or Firm_—Christie, Parker & Hale

[57] ABSTRACT

A test probe assembly includes a barrel having a hollow interior and a plunger which slides axially in the barrel. The plunger has an outer portion extending through an open end of the barrel, terminating in a contact tip outside the barrel for contact with a test point. In one embodiment, the plunger also has a hollow, elongated receptacle extending through the barrel. The receptacle has a geometric-shaped pilot hole, preferably square, spaced from the open end of the barrel. An elongated fixed guide member in the barrel extends through the pilot hole. The guide member extends through the interior of the barrel away from the pilot hole. The guide member has an outer surface of preferably square-shaped configuration engaging the pilot hole. A spring inside the barrel extends along the guide member and is biased against the internal end of the receptacle inside the barrel. Axial travel of the plunger into the barrel is against the bias of the spring. The square-shaped outer surface of the guide member, engaging the square pilot hole, controls rotational motion of the plunger as it travels along the guide member against the bias of the spring. In one embodiment, a helical configuration in the outer surface of the guide member engages the pilot hole so that axial travel of the receptacle causes the plunger to rotate about its axis, in order to provide good frictional contact between the plunger tip and the test point on a unit under test. In another embodiment, the cooperating square-shaped engaging portions of the guide member and the pilot hole provide controlled linear and non-rotational travel of the plunger relative to the barrel.

53 Claims, 4 Drawing Sheets

ELECTRICAL TEST PROBE HAVING ROTATIONAL CONTROL OF THE PROBE SHAFT

FIELD OF THE INVENTION

This invention relates to electrical contact test probes, and more particularly to spring-loaded test probes for use in electrical continuity testing of a variety of electrical devices. These test probes are generally used to produce contact between large numbers of test points on an electrical unit under test and electrical diagnostic or testing equipment.

BACKGROUND OF THE INVENTION

In the automatic testing of electrical circuits, test probes of various configurations are used, depending upon such factors as the type of electrical device under test, the spacing between test points, and the like. The present invention is applicable to many different types of contact test probes. In order to appreciate the improvements provided by this invention, one type of prior art test probe will first be described. This test probe assembly comprises a conventional spring-loaded contact probe generally including an outer receptacle, a movable plunger or probe member, and a barrel in the receptacle. In such devices the plunger or probe member is mounted in the barrel and extends outwardly from it. The barrel includes a spring so that the plunger or probe member is supported in the barrel by spring pressure. The probe member can be biased outwardly a selected distance by the spring and may be biased or depressed inwardly into the barrel a selected distance under force directed against the spring. The probe member generally has a probing end or tip which makes contact with selected test points on the electrical device under test. A printed circuit board would be an example of a unit under test.

There are many applications in which the probing end of the test probe must grip onto a particular circuit element or test point during probing. Therefore, the test probe must be designed so that it stays in good contact with the circuit test point being probed. In order to ensure good contact during probing, prior art test probes have included a large number of different probe tip configurations designed to grip onto the test point to make good contact when spring pressure is applied to the probe during testing.

Examples of instances in which good contact is required between the test probe and the circuit test point include where the board under test has been in a dirty environment, or where no de-fluxing was conducted after soldering; and therefore, the test probe must grip or bite into the conductive surface of the test point to ensure circuit continuity.

A conventional way of ensuring good probe contact is by use of a "helical" test probe assembly which includes a cylindrical barrel having an axial passage and a movable test probe which slides axially in the passage. The barrel has a coil spring inside it which applies a spring bias to a plunger during use. The plunger has a small lateral post extending outwardly and engaged in a spiral groove extending lengthwise along the barrel. The post engaged in the groove provides a means for controlling movement of the probe relative to the barrel during use. When the plunger portion of the probe assembly is depressed against the spring pressure, the post rides upwardly in the spiral groove and causes the probe shaft to rotate about its axis during probing. By twisting about its axis, the bottom contact tip portion of the probe can bite into the test point on the unit under test to provide better contact during testing.

In another approach, the post can be engaged in a linear groove to prevent the probe shaft from rotating about its axis during its linear travel. This can ensure better control over undesired lateral movement of the test probe during use and orient the plunger tip relative to the unit under test.

There are certain drawbacks to using a small lateral post and groove combination to control rotation of the probe. These disadvantages include greater cost of production and poor reliability during use, especially prolonged use involving many test cycles. The overall dimension of the test probe also is affected and limits application to close on-center spacing among test probes.

The present invention provides a test probe which, in one configuration referred to as a "helix probe", provides a means for controlling test probe motion during use, so that the contact tip portion of the probe rotates during testing for making good surface contact with the test point on the unit under test. Another embodiment, referred to as a "linear probe", provides a means for preventing rotation of the probe shaft relative to the barrel during linear travel of the probe shaft. Either embodiment of the invention avoids the disadvantages of the prior art use of a test probe with a post engaged in a groove in the barrel of the probe assembly for providing rotational control of the probe.

SUMMARY OF THE INVENTION

Briefly, this invention provides an electrical test probe assembly which includes an outer barrel and a plunger having its outer portion extending through an open end of the barrel and terminating in a contact tip outside the barrel for contact with a test point. The plunger also has bearing surfaces in the interior of the barrel. A spring in the barrel is biased against the plunger for supporting the plunger within the barrel by spring pressure. Plunger motion control against the bias of the spring is provided by a geometric-shaped pilot hole in the barrel cooperating with an elongated control surface of matching geometric-shaped cross section passing through and engaged with the inside of the pilot hole. Spring pressure applied to the plunger against the bias of the spring causes relative axial motion between the control surface and the pilot hole in the direction against the spring. The geometric-shaped pilot hole engages the geometric-shaped control surface for controlling rotation of the plunger about its axis as the plunger travels axially into the barrel against the bias of the spring. The matching geometric shapes comprise any cross-sectional configuration which creates interference when the control surface tends to rotate inside the pilot hole; the interference between the two controls rotation of the plunger about its axis as the plunger travels axially into the barrel. Cooperating triangular, rectangular and oval shapes are examples of geometric shapes that can be used with the invention. Matching square-shaped cross sections are preferred.

One embodiment of this invention includes an outer barrel and a plunger having an outer portion extending through an open end of the barrel and terminating in a contact tip for contact with a test point. The plunger also has an elongated sleeve-like receptacle extending into the interior of the barrel. The receptacle has a geometric-shaped pilot hole spaced inwardly from the open end of the barrel. An elongated fixed guide member is disposed in the interior of the barrel. The guide member extends through the pilot hole of the receptacle and also extends through the hollow interior of the barrel away from the receptacle portion of the plunger. The guide member has an elongated control surface of geometric-shaped cross-sectional configuration engaging the geometric-shaped pilot hole of the receptacle. A spring contained within the barrel surrounds the guide member and is biased against an internal end portion of the plunger inside the barrel. Axial travel of the plunger relative to the barrel is against the bias of the spring. Spring pressure applied to the plunger during probing causes the receptacle to move axially along the guide member, into the barrel and against the bias of the spring. The geometric-shaped control surface on the guide member engages the pilot hole during travel so that rotation of the plunger about its axis during its axial travel is controlled by the engaging wall portions of the geometric-shaped guide member and pilot hole.

In one embodiment in which the invention provides a "helix probe", the control surface of the guide member has a helical configuration extending along the geometric-shaped outer wall of the guide. This helical configuration is engaged with the geometric-shaped pilot hole in the barrel so that when pressure is applied to the plunger during use, causing it to travel axially into the barrel, the pilot hole on the barrel follows the helical configuration in the guide member, which causes the plunger to rotate about its axis during axial travel. This causes the contact tip portion of the probe shaft to twist during application of the spring force, applying a rotational component of force to the test point which provides better contact during probing. The clearance of the pilot hole relative to the helical configuration of the guide member, and the angle of wrap of the helical configuration are both controlled to produce the desired angle of twist of the plunger about its axis during travel.

In an alternative form of the invention, the plunger has a receptacle with a pilot hole of desired geometric cross-sectional configuration which slides axially on an elongated fixed guide member, also of matching geometric cross-sectional configuration. The cross section of the guide member is linear along its extent within the interior of the barrel. During use, engagement of the pilot hole with the control surface of the guide member causes the probe to travel axially and linearly into the barrel under spring pressure. This provides accurate linear travel of the test probe during use. It prevents the test probe from rotating about its axis during use, and its main use is in limiting any undesired lateral motion of the plunger away from the principal axis of the probe during use.

The linear probe and the helix probe embodiments both avoid use of the post and cooperating groove in the barrel arrangement used in the prior art for controlling probe shaft travel. Improvements such as reduced production costs, greater reliability during use, and reduced cross-sectional dimensions (to provide closer on-center spacing between probes) are provided by the test probe of this invention.

These and other aspects of the invention will be more fully understood by referring to the following detailed description and the accompanying drawings.

DETAILED DESCRIPTION

FIGS. 1 through 4 illustrate one embodiment of a helix probe 20 for use in making electrical contact between a test point on a unit under test (not shown) and electrical diagnostic and testing equipment (not shown). The helix probe includes an elongated, cylindrical outer barrel 22 having a hollow interior of uniform diameter from one open end 24 of the barrel to another open end 26 of the barrel. The open ends 24 and 26 of the barrel are both circular in cross section. The barrel 22 has a major axis 27, and the open ends 24 and 26 of the barrel are centered on this axis.

Figures 1, 2, 3, 4:
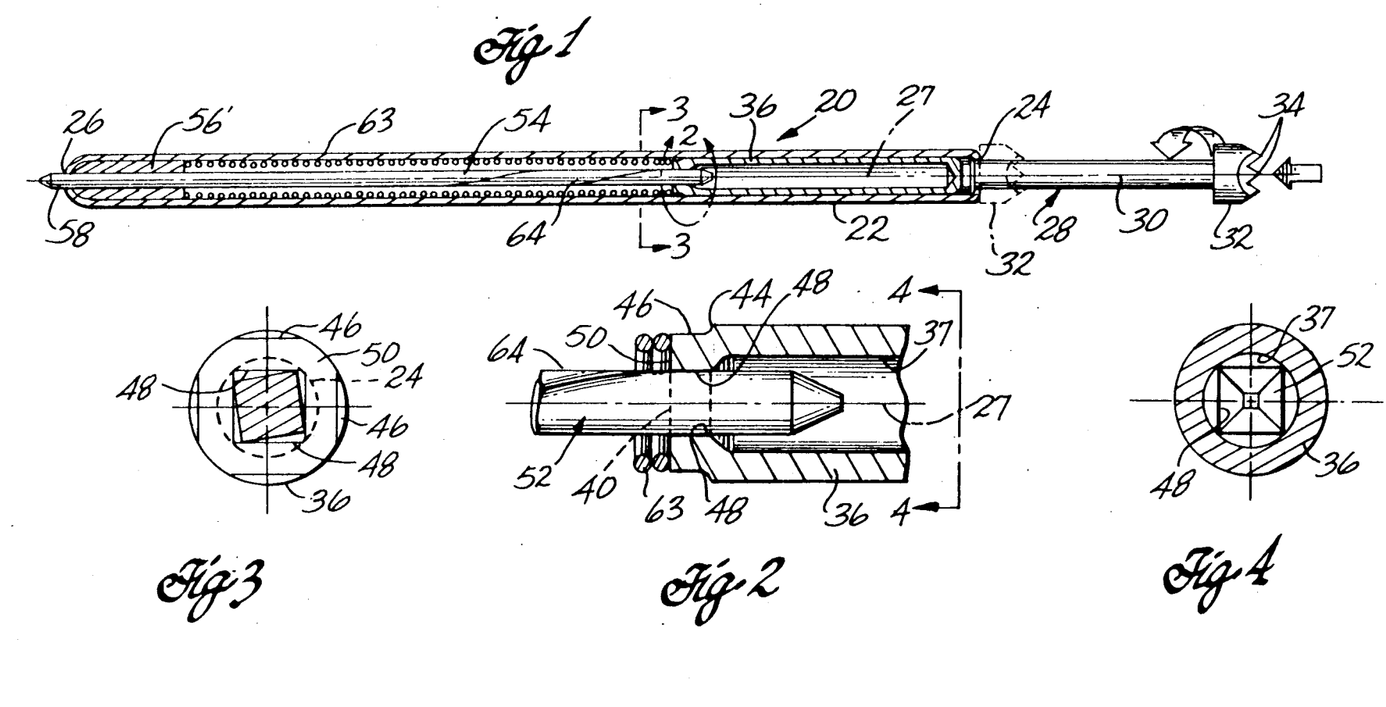
FIG. 1 is a side elevational view, partly in cross section, illustrating a helix probe according to the principles of this invention.
FIG. 2 is an enlarged, fragmentary, cross-sectional view taken within the line 2 of FIG. 1.
FIG. 3 is an enlarged cross-sectional view taken on line 3—3 of FIG. 1.
FIG. 4 is a cross-sectional view taken on line 4—4 of FIG. 2.

An elongated probe member 28 is positioned in one end portion of the barrel 22. The probe member, best illustrated in FIG. 6, includes a narrow, elongated, cylindrical plunger 30 which slides axially through the circular opening 24 in the end of the barrel. The plunger 30 normally extends outside the barrel, although during probing, the plunger slides axially into the barrel. The exterior end of the plunger 30 has a probe head 32 forming the tip of the shaft. The probe head 32 can be in various configurations to enhance gripping contact between the tip of the probe and the test point contacted by it. In the illustrated embodiment, the probe head has multiple outwardly projecting sharp-pointed tips or knife edges 34 at the contact end of the head.

Figures 5, 6:
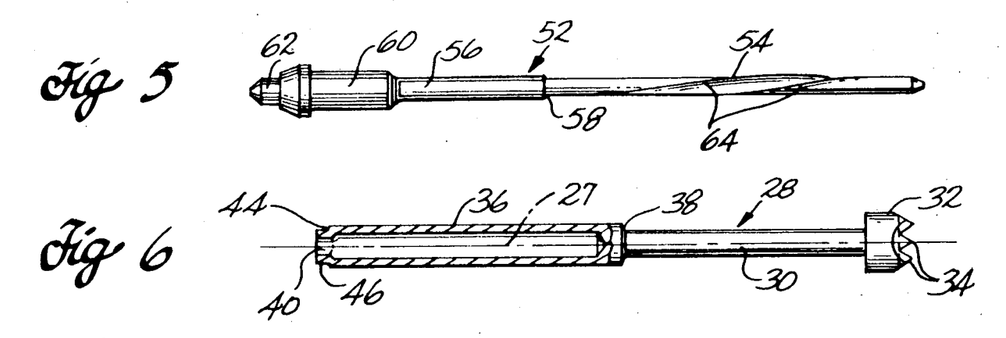
FIG. 5 is an enlarged side elevational view illustrating a guide and terminal member portion of the helix probe.
FIG. 6 is an enlarged side elevational view, partly in cross section, illustrating a plunger and receptacle portion of the helix probe.

The plunger 30 further includes an elongated, tubular receptacle portion 36 integral with an end of the plunger opposite from the probe head 32. The receptacle is a long sleeve-like device with an elongated, cylindrical inside wall 37 surrounding a hollow interior region of circular cross section and uniform diameter extending for most of the length of the barrel.

The end of the receptacle 36 opposite from the plunger 30 is reduced in diameter to form a pilot hole 40 centered on the axis 27 of the probe. The pilot hole can be of various geometric shapes, and in the illustrated embodiment the pilot hole is square-shaped in cross section. The reduced diameter end of the receptacle forms a shoulder 44 below the flats 46 forming the outside wall of the sleeve surrounding the square pilot hole 40. The inside wall of the square pilot hole 40 is formed by flats 48, shown best in FIG. 2. The pilot hole portion of the receptacle also has a flat end wall 50 of square-shaped cross-sectional configuration surrounding the pilot hole 40 at the end of the receptacle inside the barrel 22.

A combination probe guide and terminal device is disposed in the interior of the receptacle. The probe guide is one embodiment of a plunger control means for controlling rotation of the probe during axial travel. The probe guide has a narrow, elongated guide member 30 54 at one end which passes through the pilot hole of the receptacle. The major portion of the guide member extends away from the barrel, through the interior of the barrel, along the main axis of the barrel. The outside diameter of the guide member 54 is stepped up near its end to form an elongated, cylindrical section 56. The interface between the cylindrical section 56 and the guide member 54 forms an annular shoulder 58. Configuration of the terminal end of the probe guide and terminal 52 can vary. FIG. 1 illustrates one type of termination, while the probe guide and terminal shown in FIG. 5 illustrates another terminal configuration. In the embodiment of FIG. 1, an oversized cylindrical section 56' matches the inside diameter of the barrel 22, and the cylindrical portion 56' is affixed to the inside of the barrel so that the guide member 54 extends in a stationary position axially along the interior of the barrel. The outer surface of the guide member 54 is, therefore, spaced inwardly from the inside diameter of the barrel wall. In this embodiment, the end 58 of the conductive guide member 54 projects out from the end of the barrel to provide an antirotational detail for the probe assembly which mates with a square hole at the bottom of a receptacle.

In the embodiment shown in FIG. 5, a cylindrical terminal portion 60 at the end of the cylindrical section 56 is rigidly affixed to the inside of the barrel. A terminal portion 62 of the guide member projects outside the barrel, also for providing antirotation.

An elongated coil spring 63 is disposed in the interior of the barrel. The spring surrounds the fixed guide member 54 and applies spring pressure to the square shaped end 50 of the plunger 36. The opposite end of the coil spring is held in contact with the fixed annular end of the cylindrical terminal 56. The spring supports the plunger in the barrel by spring pressure. The plunger is normally biased outwardly by the spring pressure holding the annular shoulder at the end of the receptacle against the inside wall of the barrel at its end 24. This spring pressure holds the plunger shaft outside the barrel with its tip a preselected distance from the barrel. During use, the spring is biased or depressed inwardly into the barrel a selected distance under a force applied to the plunger against the bias of the spring.

The embodiment of FIGS. 1 through 6 depicts one example of a means for controlling rotation of the probe shaft about its axis. During probing, an external force applied to the tip of the plunger causes the probe to travel axially into the barrel against the bias of the spring. In one arrangement, the probe rotates or twists about its axis during its axial travel. This arrangement is referred to as a "helix probe." In an alternative arrangement, rotation of the probe shaft about its axis during axial travel is controlled by preventing rotation. In this arrangement the probe is referred to as a "linear probe."

In either embodiment, the probe assembly includes a probe shaft control means generally comprising a geometric-shaped pilot hole in the barrel cooperating with an elongated control surface of matching geometric cross section passing through the pilot hole and engaged with the pilot hole. In the illustrated embodiment the control surface is square-shaped in cross section. Spring pressure applied to the plunger against the bias of the spring causes relative axial motion between the control surface and the pilot hole in a direction against the bias of the spring. The square-shaped pilot hole engaging the cooperating square-shaped control surface controls rotation of the plunger about its axis as the plunger travels axially into the barrel against the bias of the spring. FIGS. 1 through 6 depict one embodiment of this probe shaft control means in which the pilot hole is on the receptacle of the plunger inside the barrel, and the control surface for controlling rotation of the plunger is on the fixed guide member 54 which engages the pilot hole of the barrel.

The embodiment of FIGS. 1 through 6 is a helix probe in which the control surface comprises a helical configuration 64 extending along the outer surface of the guide member 54. The helical configuration 64 wraps around the outside of the guide member and has a uniform pitch extending axially along the guide member. The preferred technique for forming the helical configuration is to first fabricate the guide member 54 as a long straight solid post of square cross section and uniform size from end to end. The post is then twisted about its axis at the desired pitch angle to form the helical configuration. In the illustrated embodiment, the guide member 54 of uniform square cross section which has been twisted 270 degrees to form a helical outer surface. As a result, the cross section of the post at any plane perpendicular to its axis remains square in cross section, although the angle of rotation of the square progressively turns in travel from one end of the post toward the other.

The square cross section of the post is slightly less in area than the square cross section of the pilot hole so that the guide member can pass through the pilot hole. In the normal (unbiased) position of the probe shown in FIG. 1, the flats on the OD of the guide member are aligned with the flats on the OD of the pilot hole, except that a slight angular rotation of the guide member relative to the fixed pilot hole is permitted. This arrangement is best illustrated in FIG. 3.

During use of the probe assembly shown in FIGS. 1 through 6, the outer barrel 22 is held in a fixed (non-rotational) position. Preferably, the probe assembly is attached to a fixture for cycling the probe toward a unit under test. The fixture is then lowered toward the unit under test so that the tip of the plunger engages a test point or node on the unit under test. When the plunger is cycled downwardly against the test point, spring pressure is applied against the bias of the spring 63. This force causes the plunger to travel into the barrel and compress the spring. During cycling, the head of the plunger can travel axially to the position of the head 32 shown in phantom lines in FIG. 1. As the plunger travels axially into the barrel 22, the receptacle 36 on the plunger travels axially along the fixed guide member 54. Since the pilot hole of the receptacle is engaged with the cooperating helical configuration surface of the fixed guide member, axial travel of the plunger into the barrel causes the square pilot hole of the receptacle to follow the helical configuration in the square guide member. This produces a controlled rotation of the plunger about the axis of the barrel as the probe travels into the barrel against the bias of the spring. The matching square shapes of the pilot hole and the guide member create an interference if the pilot hole is normally rotated relative to the guide member. However, the axial force applied to the plunger causes the pilot hole to follow the helical guide, which causes the plunger to twist about its axis. The angle of pitch of the helical configuration and the size of the square pilot hole relative to the size of the square cross section of the guide member can be varied to control the amount of twisting of the plunger about its axis as it travels into the barrel. In the embodiment illustrated in FIG. 1, the plunger twists about 100 to about 110 degrees about its axis during its full stroke length of travel into the barrel.

Thus, in a use of the probe assembly in which it is desirable to produce good mechanical contact between the test point and the tip of the plunger, the rotational action of the plunger during its axial travel into the barrel causes the tip of the shaft to bite into the surface of the test point on the unit under test. This probe arrangement can be useful in testing of test points on a unit under test which has been in a dirty environment, or in which de-fluxing was not thoroughly carried out before testing, or where a protective conformal coating has been applied.

Figure 7:
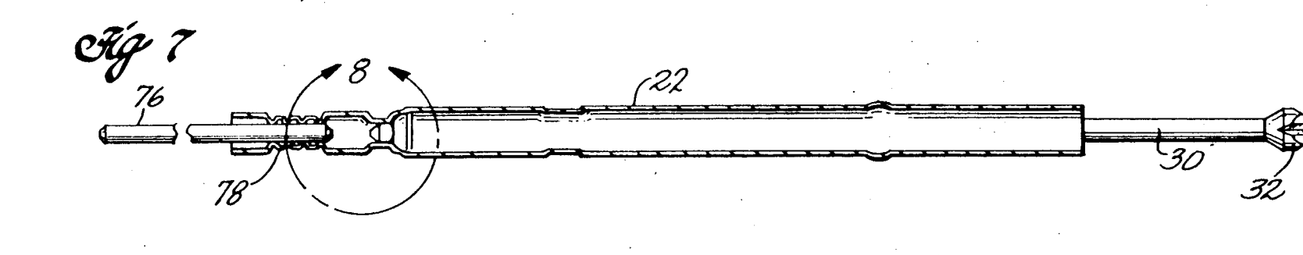
FIG. 7 is a fragmentary side elevational view, partly in cross section, illustrating a probe assembly mounted in a receptacle, which is an alternative arrangement of a terminal end portion of the probe.
Figure 8:
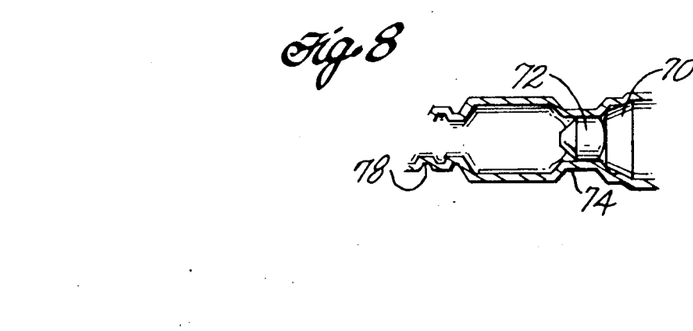
FIG. 8 is an enlarged fragmentary view taken within the line 8 in FIG. 7 and showing a square nub detail on a terminal mating with an antirotation detail (square hole) in the receptacle.

FIGS. 7 and 8 schematically illustrate a helix probe assembly similar to FIGS. 1 through 6, but with a means of antirotational. In FIG. 7 certain components of the helix probe are not shown for simplicity. The illustration of FIG. 7 shows the probe shaft 30 projecting from the end of the barrel 22, and in this arrangement the helical control means are provided for rotating the shaft 30 about its axis as it travels axially into the barrel during probing. At the terminal end of the probe, the guide member has a terminal 70 with a reduced diameter projection 72 which is preferably square or rectangular in cross section. The outside diameter of the outer receptacle has a cooperating reduced diameter section 74 also of matching square or rectangular cross section surrounding the projection 72. During use, the squared off and cooperating projection on the guide member engages the reduced diameter section of the receptacle so that the barrel does not rotate about its axis when force is applied to the plunger. Thus, when the outer receptacle is held in a fixed position in a fixture or the like, an axially directed force applied to the tip of the shaft causes the probe shaft to rotate about the guide member, but the guide member remains fixed relative to the receptacle so that no rotational motion of the probe shaft is transmitted elsewhere to the fixed portions of the probe assembly.

Figures 9, 10:
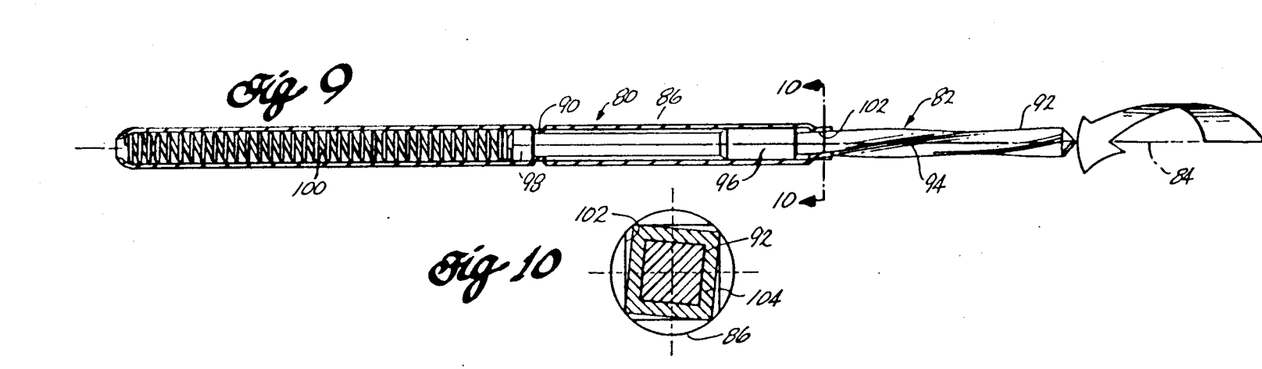
FIG. 9 is a side elevational view, partly in cross section, illustrating an alternative embodiment of a helix probe.
FIG. 10 is a cross-sectional view taken on line 10—10 of FIG. 9.

FIGS. 9 and 10 show an alternative embodiment of a helix probe in which the pilot hole and control surface for controlling rotation of the plunger are arranged differently from the embodiment shown in FIGS. 1 through 6. In FIG. 9 the probe assembly includes an outer barrel 80 and a movable plunger 82 which slides axially inside the barrel while also rotating about its axis 84. The barrel has a tubular first section 86 and a necked down region 90 which forms an annular wall inside the barrel to provide a stop for plunger travel in the barrel. The plunger 92 outside the barrel is square in cross-sectional configuration, as shown in FIG. 10. However, the plunger is also twisted about its axis to form a helical configuration 94 which wraps around the axis of the plunger. The plunger extends into the inside of the first section 86 of the barrel where a first cylindrical bearing surface 96 on the plunger rides against the inside diameter of the barrel during travel of the plunger in the barrel. The end of the plunger includes a cylindrical bearing surface 98 which rides on the inside of the of the barrel. A coil spring 100 inside the barrel applies spring pressure to the bearing portion 98 of the plunger. The helix portion of the probe shaft extends through a pilot hole 102 in the end of the barrel. The pilot hole extends through a necked down end portion 104 of the barrel which is twisted along its length to match the helical shape of the probe shaft. This arrangement is best illustrated in FIG. 10.

During use, the barrel 80 of the probe assembly is held in a fixed position; and as the probe is lowered toward the test point of the unit under test, spring pressure is applied to the tip of the plunger 92 causing the shaft to travel axially into the barrel against the bias of the spring. The cooperating square fixed pilot hole and square cross-sectional configuration of the helical shaft of the plunger create an interference if one is normally rotated relative to the other, but they cause the plunger to rotate about its axis as the plunger travels axially into the barrel.

Figure 11:
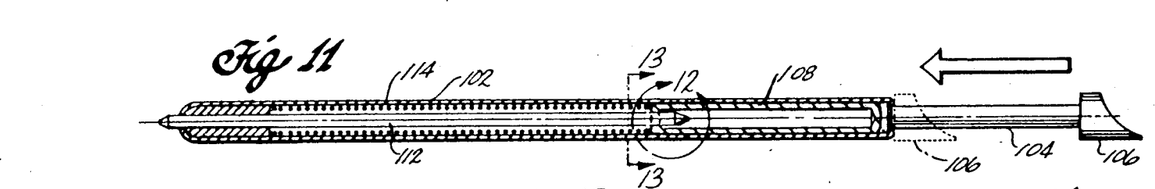
FIG. 11 is a side elevational view, partly in cross section, illustrating a linear probe embodiment of this invention.
Figure 12:
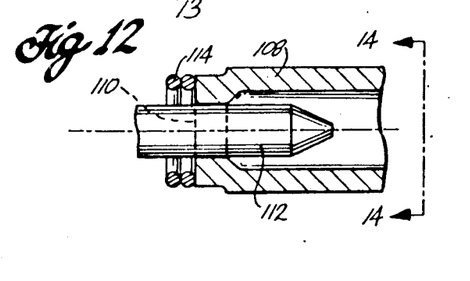
FIG. 12 is an enlarged, fragmentary cross-sectional view taken within the line 12 of FIG. 11.
Figure 13:
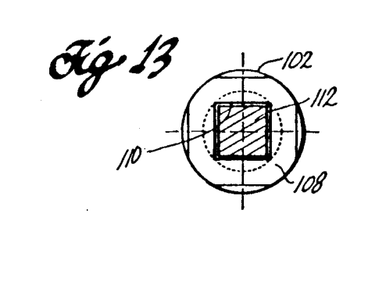
FIG. 13 is a cross-sectional view taken on line 13—13 of FIG. 11.
Figure 14:
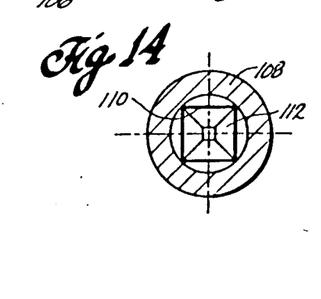
FIG. 14 is a cross-sectional view taken on line 14—14 of FIG. 12.

FIGS. 11 through 14 illustrate a further alternative embodiment of the invention which comprises a linear probe. This embodiment of the invention is similar in assembly to the probe shown in FIGS. 1 through 6, except that the guide member in the probe assembly is not twisted as a helix but remains square in cross section and linear to prevent rotation of the plunger about its axis during its axial travel. Referring to FIG. 11, this arrangement includes an outer barrel 102, a probe assembly which includes a plunger 104, with a tip 106 for making contact with the test point of the unit under test, and a receptacle 108 at the internal end of the plunger. A pilot hole 110 of square cross-sectional configuration is formed at a necked down end of the receptacle, and an elongated guide member 112 is affixed in a stationary position inside the barrel and extends through the pilot hole 110 of the receptacle. The guide member 112 is square in cross section and essentially matches the cross-sectional configuration of the pilot hole 110. Axial travel of the shaft 104 into the interior of the barrel against the bias of the spring 114 causes the receptacle 108 to travel along the length of the rigid guide member 112.

Owing to the cooperating square cross sections of the pilot hole and the guide member, travel of the plunger follows a linear path and is non-rotational about its axis. This means for controlling motion of the plunger provides a means for preventing any lateral motion of the shaft that may occur during probing and therefore provides an accurate means of control over the axis along which the probe operates.

The linear probe can be in other alternative configurations, such as one similar to the arrangement shown in FIGS. 10 and 11, except that the helical twist in the probe shaft is eliminated. Moreover, other geometric configurations other than square can be used for such a linear probe.

Figures 15, 16:
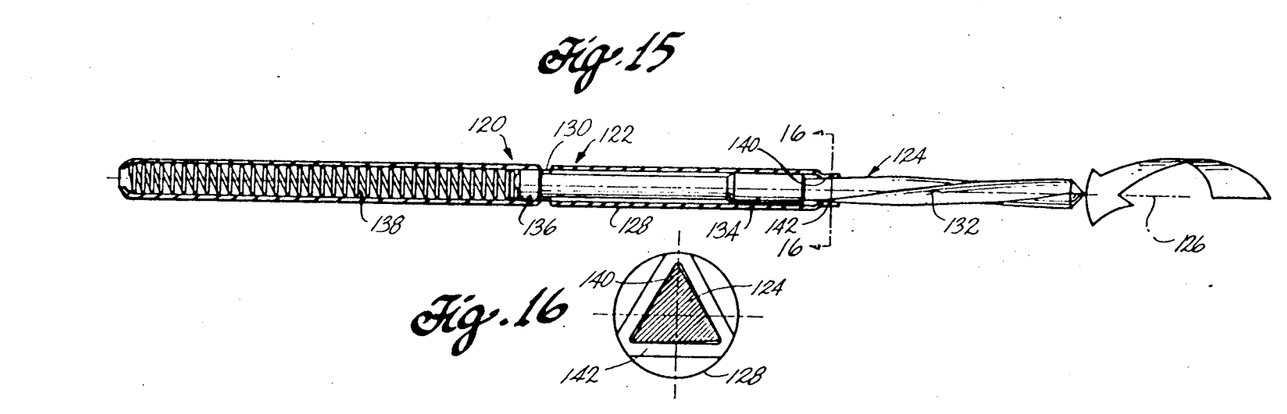
FIG. 15 is a side elevational view, partly in cross section, illustrating, a further alternative embodiment of a helix problem having a triangular-shaped pilot hole and plunger control surface.
FIG. 16 a cross-sectional view taken on line 16—16 of FIG. 15.

FIGS. 15 and 16 illustrate a further embodiment of a helix probe 120. In the previously described embodiments, the pilot hole is square in cross section and the plunger control surface also is square in cross-sectional configuration. These embodiments are examples of a preferred technique for carrying out the invention, however, other embodiments having different cross-sectional configurations are possible. To carry out the principles of the invention, the pilot hole and plunger control surface can have matching geometric configurations of various shapes. Preferably, the cross-sectional configuration of the pilot hole and plunger control surface are any cross section which is not circular and that resists torque loading (1) when the control surface and pilot hole are aligned on the same axis, (2) with the pilot hole surrounding the plunger control surface, and (3) when relative rotation is produced between the plunger control surface and pilot hole about their common axis. In a helix probe arrangement, the cooperating geometric shapes also provide a guide means in which an axial force applied to the plunger causes the plunger control surface to engage the pilot hole and twist the plunger about its axis as the plunger travels relative to the pilot hole. The non-round engaging surfaces of the plunger control surface and pilot hole create an interference that applies a torque to the plunger that causes it to twist about its axis. In the helix probe 120 illustrated in FIGS. 15 and 16, the cooperating pilot hole and plunger control surfaces are triangular in cross section. The probe assembly 120 includes an outer barrel 122 and a movable plunger 124 which slides axially into the barrel while also rotating about its axis 126. The barrel has a tubular first section 128 and a necked-down region 130 which forms an annular wall inside the barrel to provide a stop for plunger travel in the barrel. The plunger outside the barrel is triangular in cross-sectional configuration as shown best in FIG. 16. However, the plunger is also twisted about its axis to form a helical configuration 132 which wraps around the axis of the plunger at a uniform pitch. The plunger extends into the inside of a first section of the barrel where a first cylindrical bearing surface 134 on the plunger rides against the inside diameter of the barrel during travel of the plunger in the barrel. The end of the plunger includes a cylindrical bearing surface 136 which rides on the inside of the barrel. A coil spring 138 inside the barrel applies spring pressure to the bearing portion 136 of the plunger. The helix portion of the probe shaft extends through a pilot hole 140 in the end of the barrel. The pilot hole is of triangular cross-sectional configuration and extends through a necked-down end portion 142 of the barrel which is twisted along its length to match the helical shape of the probe shaft. This arrangement is best shown in FIG. 16.

During use, the barrel of the probe assembly is held in a fixed position; and as the probe is lowered toward the test point of the unit under test, spring pressure is applied to the tip of the plunger, causing the shaft to travel axially into the barrel against the bias of the spring. The cooperating triangular fixed pilot hole and triangular cross-sectional configuration of the helical shaft of the plunger cause the plunger to rotate about its axis as the plunger travels axially into the barrel.

Of the other various cross-sectional configurations of the pilot hole and plunger control surface which can be used, it is preferred that they are matching geometric configurations which are symmetrical about the axis of the plunger control surface and pilot hole. For instance, shapes such as oval, X-shaped, rectangular and other polygon forms can be used. To avoid binding and provide reduced wear, a regular polygon cross section (flat sides of uniform length around a rotational axis of symmetry) is desirable.

What is claimed is:

1. An electrical test probe assembly for making contact with a test point on a unit under test in an electrical continuity diagnostic test device, the test probe comprising:

a barrel having a hollow interior;

a plunger having an outer portion extending through an open end of the barrel and terminating in a contact tip outside the barrel for contact with a test point, the plunger also having a hollow elongated receptacle extending into the interior of the barrel, said receptacle having a geometric-shaped pilot hole spaced inwardly from the open end of the barrel;

an elongated fixed guide member disposed in the barrel interior and extending through the pilot hole of the receptacle, the guide member extending through the hollow interior of the barrel away from the receptacle of the plunger, the guide member having an outer surface of geometric-shaped cross-sectional configuration engaging the geometric-shaped pilot hole of the receptacle; and spring means inside the barrel, extending along the length of the guide member, and biased against a portion of the receptacle inside the barrel, so that axial travel of the plunger and its receptacle is against the bias of the spring means, the geometric-shaped outer surface of the guide member engaging the geometric-shaped pilot hole of the receptacle so that normal relative rotation between the pilot hole and the geometric-shaped outer surface of the guide member is resisted, while said spring bias causes said axial travel for controlling rotation of the plunger about its axis as the receptacle of the plunger travels axially relative to the guide member into the interior of the barrel against the bias of the spring means.

2. Apparatus according to claim 1 in which the geometric-shaped outer surface portion of the guide member is of helical configuration, so that a force applied to the plunger causing the plunger to travel into the barrel against the bias of the spring means causes the plunger to rotate about its axis, said rotation being controlled by engagement of the pilot hole of the receptacle traveling along the helical configuration of the guide member.

3. Apparatus according to claim 1 in which axial plunger travel relative to the guide member is linear and non-rotational.

4. Apparatus according to claim 1 in which the cooperating geometric shapes of the pilot hole and the outer surface of the guide member are of polygon configuration.

5. An elongated electrical test probe assembly for making contact with a test point on a unit under test in an electrical continuity diagnostic test device, the test probe comprising:

a barrel having an elongated tubular outer wall surrounding a hollow interior area which extends along an axis of the plunger travel;

a plunger disposed in the barrel and having an outer portion extending through an open end of the barrel and terminating in a contact tip outside the barrel for contact with a test point, the plunger also having a bearing portion disposed within the interior of the barrel; and spring means disposed in the barrel and biased against the bearing portion of the plunger for supporting the plunger within the barrel by spring pressure, so that axial travel of the plunger into the barrel is against the bias of the spring means;

the outer wall of the barrel having a relatively short wall portion of reduced diameter cross section which is deformed around the plunger with inwardly projecting control surfaces forming sides of a polygon-shaped pilot hole in the barrel wall surrounding and elongated with the plunger;

the plunger having an elongated control surface of helical configuration with an axial pitch and a polygon-shaped cross section matching the polygon-shaped cross section of the pilot hole, the plunger control surface being engaged with said pilot hole in the barrel so that pressure applied to the plunger against the bias of the spring means causes the control surface of the plunger to travel axially relative to the pilot hole in a direction against the bias of the spring means, the polygon-shaped pilot hole cooperating with the polygon-shaped control shaped pilot hole cooperating with the polygon-shaped control surface for causing rotation of the plunger about its axis as the plunger travels axially into the barrel against the bias of the spring means for rotating the contact tip during its contact with the test point.

6. Apparatus according to claim 5 in which the pilot hole is square, and the plunger is square in cross section and is twisted on its axis to form the helical pitch of the control surface.

7. Apparatus according to claim 5 in which the pilot hole is formed on a short end portion of the barrel.

8. Apparatus according to claim 5 in which the polygon shapes of the pilot hole and plunger control surface are square.

9. Apparatus according to claim 5 in which the polygon shapes of the pilot hole and plunger control surface are triangular.

10. Apparatus according to claim 5 in which the wall of the barrel is deformed with generally flat control surfaces spaced apart around the pilot hole axis to define the sides of the polygon-shaped pilot hole, in which the flat control surfaces on the barrel are deformed inwardly into engagement with corresponding surfaces of the helical control surface on the plunger to form said matching polygon-shaped cross sections 11. Apparatus according to claim 5 in which the pilot hole is square, and in which the plunger is square in cross section and is twisted on its axis to form the helical pitch of the control surface.

12. Apparatus according to claim 5 in which the pilot hole is triangular, and in which the plunger is triangular in cross section and is twisted on its axis to form the helical pitch of the control surface.

13. Apparatus according to claim 5 in which the length of the deformed portion of the barrel wall is substantially shorter than the length of a complete axial revolution of the helical control surface on the plunger.

14. An electrical test probe assembly for making contact with a test point on a unit under test in an electrical continuity diagnostic test device, the test probe comprising:

a barrel having a hollow interior;

a plunger having an outer portion extending through an open end of the barrel and terminating in a contact tip outside the barrel for contact with a test point, the plunger also having a hollow elongated receptacle extending into the interior of the barrel, said receptacle having a square-shaped pilot hole spaced inwardly from the open end of the barrel;

an elongated fixed guide member disposed in the barrel interior and extending through the pilot hole of the receptacle, the guide member extending through the hollow interior of the barrel away from the receptacle of the plunger, the guide member having an outer surface of square-shaped cross-sectional configuration engaging the square-shaped pilot hole of the receptacle; and spring means inside the barrel, extending along the length of the guide member, and biased against an internal end of the receptacle inside the barrel, so that axial travel of the plunger and its receptacle is against the bias of the spring means, the square-shaped outer surface of the guide member engaging the pilot hole of the receptacle for controlling rotation of the plunger about its axis as the receptacle of the plunger travels axially relative to the guide member into the interior of the barrel against he bias of the spring means.

15. Apparatus according to claim 14 in which the square-shaped outer surface portion of the guide member is of helical configuration, so that a force applied to the plunger causing the plunger to travel axially into the barrel against the bias of the spring means causes the plunger to rotate about its axis, said rotation being controlled by engagement of the pilot hole of the receptacle traveling along the helical configuration in the guide member.

16. Apparatus according to claim 14 in which axial plunger travel relative to the guide member is linear and non-rotational.

17. An elongated electrical test probe assembly for making contact with a test point on a unit under test in an electrical continuity diagnostic test device, the test probe comprising:

a barrel having an elongated tubular outer wall surrounding a hollow interior area which extends along an axis of plunger travel;

a plunger disposed in the barrel for travel along said axis and having an outer portion extending through an open end of the barrel and terminating in a contact tip outside the barrel for contact with the test point, the plunger also having an internal portion disposed within the interior of the barrel; and spring means disposed in the barrel and biased against the internal portion of the plunger for supporting the plunger within the barrel by spring pressure, so that axial travel of the plunger into the barrel is against the bias of the spring means;

the outer wall of the barrel being deformed as a relatively short tubular wall portion of reduced diameter cross section with inwardly projecting, generally flat control surfaces forming generally flat sides of a geometric-shaped pilot hole in the barrel wall surrounding the plunger and engaged with an elongated control surface on the plunger, the plunger control surface having a helical configuration with an axial pitch for causing the plunger to rotate about its axis during axial travel of the helical control surface through the fixed pilot hole of the barrel, for thereby rotating the contact tip for enhancing frictional contact between the contact tip and the test point of the unit under test.

18. Apparatus according to claim 17 in which the geometric shapes of the pilot hole and the control surface of the barrel wall are square.

19. Apparatus according to claim 17 in which the geometric shapes of the pilot hole and the control surface of the barrel wall are triangular.

20. Apparatus according to claim 17 in which the pilot hole is square, and the plunger is square in cross section and twisted on its axis to form the helical pitch of the control surface.

21. Apparatus according to claim 17 in which the helical control surface is on an exterior portion of the plunger, and the pilot hole is in a fixed position in an end portion of the barrel spaced axially from the internal portion of the plunger which contacts the spring means.

22. An elongated electrical test probe assembly for making contact with a test point on a unit under test in an electrical continuity diagnostic test device, the test probe assembly comprising:

a barrel having an elongated tubular outer wall surrounding a hollow interior area which extends along an axis of plunger travel;

a plunger disposed in the barrel for travel along said axis and having an outer portion extending through an open end of the barrel and terminating in a contact tip outside the barrel for contact with a test point on a unit under test, the plunger also having a bearing portion slidably disposed within the interior of the barrel; and spring means disposed in the barrel and biased against the bearing portion of the plunger for supporting the plunger within the barrel by spring pressure, so that axial travel of the plunger into the barrel is against the bias of the spring means;

the outer wall of the tubular barrel having a relatively short wall portion of reduced diameter cross section which is deformed around the plunger with inwardly projecting control surfaces forming a geometric-shaped pilot hole in the barrel wall surrounding and engaged with the plunger;

the plunger having an elongated control surface of helical configuration with an axial pitch engaged with said pilot hole in the barrel wall, the helical control surface of the plunger having a geometric-shaped cross section matching the geometric-shaped cross section of the pilot hole on the barrel so that normal relative rotation between the geometric-shaped plunger control surface and the pilot hole is resisted, while axial pressure applied to the plunger against the bias of the spring means causes the control surface of the plunger to travel axially in the barrel relative to the pilot hole and in a direction against the bias of the spring means, with the geometric-shaped pilot hole engaging the geometric-shaped control surface to thereby cause the plunger to rotate about its axis as the plunger travels axially into the barrel to apply a twisting action between the contact tip of the plunger and the test point on the unit under test.

23. Apparatus according to claim 22 in which the geometric shapes of the pilot hole and control surface on the plunger are of polygon configuration.

24. Apparatus according to claim 23 in which the polygon shapes are square.

25. Apparatus according to claim 23 in which the polygon shapes are triangular.

26. Apparatus according to claim 22 in which the pilot hole is formed on an end portion of the barrel and is spaced axially from the bearing portion of the plunger.

27. Apparatus according to claim 22 in which the wall of the barrel is deformed with generally flat control surfaces surrounding the pilot hole axis.

28. Apparatus according to claim 27 in which the flat control surfaces are elongated with a short axial twist matching the helical shape of the plunger control surface.

29. Apparatus according to claim 22 in which the pilot hole is square, and in which the plunger is square in cross section and is twisted on its axis to form the helical pitch of the plunger control surface.

30. Apparatus according to claim 22 in which the pilot hole is triangular, and in which the plunger is triangular in cross section and is twisted on its axis to form the helical pitch of the plunger control surface.

31. Apparatus according to claim 22 in which the length of the deformed portion of the barrel wall is substantially shorter than the length of a complete axial revolution of the helical control surface on the plunger.

32. An elongated electrical test probe assembly for making contact with a test point on a unit under test in an electrical continuity diagnostic test device, the test probe comprising:

a barrel having an elongated tubular outer wall surrounding a hollow interior area which extends along an axis of plunger travel;

a plunger disposed in the barrel and having an outer portion extending through an open end of the barrel and terminating in a contact tip outside the barrel for contact with a test point; and spring means disposed in the barrel and biased against the plunger for supporting the plunger within the barrel by spring pressure so that axial travel of the plunger into the barrel is against the bias of the spring means;

the outer wall of the barrel having a relatively short wall portion of reduced diameter cross section which is deformed around the plunger forming a generally triangular-shaped pilot hole with generally flat inwardly projecting control surfaces in the barrel wall surrounding and engaged with the plunger;

the plunger having an elongated control surface of helical configuration with an axial pitch engaged with said pilot hole in the barrel, the helical control surface of the plunger having a generally triangular-shaped cross section matching the generally triangular-shaped cross section of the pilot hole on the barrel so that pressure applied to the plunger against the bias of the spring means causes the plunger to travel axially relative to the pilot hole in a direction against the bias of the spring means, the control surfaces of the triangular-shaped pilot hole cooperating with the plunger control surface for causing the plunger to rotate about its axis as the plunger travels axially into the barrel for rotating the contact tip during its contact with the test point.

33. Apparatus according to claim 32 in which the pilot hole is formed on an end portion of the barrel.

34. Apparatus according to claim 32 in which the flat control surfaces of the pilot hole are elongated with a short axial twist matching the helical shape of the plunger control surface.

35. Apparatus according to claim 32 in which the length of the deformed portion of the barrel wall is substantially shorter than the length of a complete axial revolution of the helical control surface on the plunger.

36. An elongated electrical test probe assembly for making contact with a test point on a unit under test in an electrical continuity diagnostic test device, the test probe comprising:
 a barrel having an elongated tubular outer wall surrounding a hollow interior area which extends along an axis of plunger travel;
 a plunger disposed in the barrel for travel along said axis and having an outer portion extending through an open end of the barrel and terminating in a contact tip outside the barrel for contact with a test point; and
 spring means disposed in the barrel interior and biased against the plunger for supporting the plunger within the barrel by spring pressure so that axial travel of the plunger into the barrel is against the bias of the spring means;
 the outer wall of the tubular barrel being deformed as a relatively short wall portion of reduced diameter cross section with inwardly projecting control surfaces forming a geometric-shaped pilot hole in the barrel wall surrounding said axis of plunger travel;
 the plunger having an elongated control surface of geometric-shaped cross section matching the geometric-shaped cross section of the pilot hole and engaged with the pilot hole in the barrel so that pressure applied to the plunger against the bias of the spring means causes the control surface of the plunger to travel axially relative to the pilot hole in a direction against the bias of the spring means, the geometric-shaped pilot hole cooperating with the control surface on the plunger for resisting rotation of the plunger about its axis during axial travel of the plunger into the barrel for thereby producing controlled linear and non-rotational travel of the plunger axially into and out of the barrel.

37. Apparatus according to claim 36 in which the matching geometric shapes are square.

38. Apparatus according to claim 36 in which the matching geometric shapes are triangular.

39. Apparatus according to claim 36 in which the wall of the barrel is deformed as a polygon shape with generally flat control surfaces surrounding the pilot hole axis.

40. An elongated electrical test probe assembly for making contact with a test point on a unit under test in an electrical continuity diagnostic test device, the test probe comprising:
 a barrel having an elongated tubular outer wall surrounding a hollow interior area which extends along an axis of plunger travel;
 a plunger disposed in the barrel for travel along said axis and having an outer portion extending through an open end of the barrel and terminating in a contact tip outside the barrel for contact with a test point; and
 spring means disposed in the barrel interior and biased against the plunger for supporting the plunger within the barrel by spring pressure so that axial travel of the plunger into the barrel is against the bias of the spring means;
 the outer wall of the tubular barrel being crimped to form inwardly projecting guide detents forming a polygon-shaped pilot hole of the barrel wall surrounding and engaged with the plunger;
 the plunger having an elongated control surface of helical configuration with an axial pitch engaging the guide detents of the crimped pilot hole wall of the barrel so that pressure applied to the plunger against the bias of the spring means causes the control surface of the plunger to travel axially relative to the fixed pilot hole and engage the guide detents thereof to thereby rotate the plunger about its axis as the plunger travels into the barrel for rotating the contact tip during its contact with the test point on the unit under test.

41. Apparatus according to claim 40 in which the pilot hole is in an end portion of the barrel.

42. Apparatus according to claim 40 in which the polygon shapes of the plunger control surface and the pilot hole are square.

43. Apparatus according to claim 40 in which the polygon shapes of the plunger control surface and pilot hole are triangular.

44. Apparatus according to claim 40 in which the guide detents of the pilot hole comprise generally flat surfaces of polygon configuration with a short axial twist matching the helical configuration of the plunger control surface.

45. Apparatus according to claim 40 in which the length of the deformed portion of the barrel wall is substantially shorter than the length of a complete axial revolution of the helical control surface on the plunger.

46. Apparatus according to claim 40 in which the guide detents of the pilot hole comprise generally flat sides of polygon configuration matching the cross-sectional configuration of the plunger control surface.

47. Apparatus according to claim 5 in which the plunger is of polygon shape in cross section with spiral grooves to form the helical configuration of the plunger control surface, and in which the inwardly projecting control surfaces on the barrel are engaged in the spiral grooves of the plunger control surface.

48. Apparatus according to claim 17 in which the length of the deformed portion of the barrel wall is substantially shorter than the length of a complete axial revolution of the helical control surface on the plunger.

49. Apparatus according to claim 17 in which the wall of the barrel is deformed with inwardly projecting control surfaces spaced apart around the pilot hole axis to define the sides of the geometric-shaped pilot hole, and in which the control surfaces on the barrel are deformed inwardly into engagement with corresponding surfaces of the helical control surface on the plunger.

50. Apparatus according to claim 17 in which the internal portion of the plunger is of polygon shape in cross section with spiral grooves to form the helical configuration of the plunger control surface, and in which the flat control surfaces of the barrel wall are engaged in corresponding spiral grooves formed on the control surface of the plunger.

51. Apparatus according to claim 22 in which the plunger is of polygon shape in cross section with spiral grooves to form the helical configuration of the plunger control surface, and in which the inwardly projecting control surfaces of the deformed barrel wall are engaged in the spiral grooves of the plunger control surface.

52. Apparatus according to claim 40 in which the guide detents of the geometric-shaped pilot hole comprise circumferentially spaced-apart, individual control surfaces projecting into the interior of the barrel and engaged with the helical control surface on the plunger.

53. Apparatus according to claim 40 in which the plunger control surface is of polygon shape in cross section with spiral grooves to form the helical configuration of the plunger control surface, and in which the guide detents on the barrel are engaged in the spiral grooves on the plunger.

* * * * *